United States Patent [19]

Sakamoto et al.

[11] 3,893,032

[45] July 1, 1975

[54] CHANNEL SELECTION DEVICE

[75] Inventors: Yoichi Sakamoto, Toyonaka; Yukio Koyanagi, Suita, both of Japan

[73] Assignee: Matsushita Electric Industrial Co., Ltd., Osaka, Japan

[22] Filed: Dec. 22, 1971

[21] Appl. No.: 210,876

[30] Foreign Application Priority Data

| | | |
|---|---|---|
| Dec. 28, 1970 | Japan | 45-124784 |
| Dec. 28, 1970 | Japan | 45-124776 |
| Dec. 28, 1970 | Japan | 45-124780 |
| Dec. 28, 1970 | Japan | 45-124782 |
| Dec. 28, 1970 | Japan | 45-124775 |
| Dec. 28, 1970 | Japan | 45-124781 |
| Dec. 28, 1970 | Japan | 45-124783 |
| Dec. 28, 1970 | Japan | 45-124774 |
| Mar. 3, 1971 | Japan | 46-11412 |
| Mar. 3, 1971 | Japan | 46-11413 |
| Mar. 3, 1971 | Japan | 46-11414 |
| Mar. 3, 1971 | Japan | 46-11415 |
| Mar. 3, 1971 | Japan | 46-11416 |
| Mar. 3, 1971 | Japan | 46-11417 |

[52] U.S. Cl. .................. 325/334; 325/459; 325/470

[51] Int. Cl. .................. H04b 1/32

[58] Field of Search ........... 325/468, 469, 470, 422, 325/334, 332, 418, 419, 420, 421, 423, 464, 20, 26; 331/46, 47, 2, 4, 37, 46, 48, 49, 55; 333/17

[56] References Cited

UNITED STATES PATENTS

| | | | |
|---|---|---|---|
| 2,954,465 | 9/1960 | White | 325/334 X |
| 3,566,299 | 2/1971 | Bruckner | 334/15 |
| 3,611,152 | 10/1971 | Sakai et al. | 325/469 X |
| 3,619,788 | 11/1971 | Giles, Jr. et al. | 325/470 X |
| 3,641,434 | 2/1972 | Yates et al. | 325/25 X |
| 3,671,870 | 6/1972 | Wellhausen | 325/470 |

*Primary Examiner*—Benedict V. Safourek
*Attorney, Agent, or Firm*—Milton J. Wayne

[57] ABSTRACT

In addition to a main local sweep oscillator in a tuner capable of sweeping at an oscillation frequency, an auxiliary local oscillator capable of sweeping at an oscillation frequency is provided, and the sweep by the main sweep oscillator and that by the auxiliary local oscillator are altered at a predetermined frequency width. When a desired channel is selected, both the main sweep oscillator and auxiliary local oscillator stop the sweep.

20 Claims, 9 Drawing Figures

INVENTOR.

BY

INVENTOR.

BY

INVENTOR.

BY

INVENTOR.

BY

*INVENTOR.*

*BY*

INVENTOR.

BY

INVENTOR.

BY

INVENTOR.

BY

*INVENTOR.*

*BY*

CHANNEL SELECTION DEVICE

BACKGROUND OF THE INVENTION

The present invention relates to a channel selection device for use, for example, with a television receiver.

In a channel selection device in which variable capacity diodes are used as capacitor elements in a tuning circuit and a resonance circuit in a tuner, two systems have been used for obtaining the tuning voltage applied across the variable capacity diodes. The first system employs preset variable resistors and pushbuttons, and the second system is the so-called automatic tuning system in which the voltage from the voltage sweep circuit is applied across the variable capacity diodes, and when a desired intermediate frequency is produced, the sweep is stopped. In the former system, the channel selection device becomes large in size because the variable resistors equal in number to the channels must be provided, and the presetting for each channel is required when the channel selection device is installed or as needs demand. The channel selection device of the automatic tuning system has a defect that a selected channel is unstable and is stepped to the next channel due to the fading or interruption of the signals.

SUMMARY OF THE INVENTION

The present invention was made to overcome these problems encountered in the prior art channel selection devices. Briefly stated, according to the present invention, in addition to a local oscillator in a tuner, another sweep oscillator is provided. Therefore, the presetting for each channel is not required, and the digital display of a selected channel becomes possible. Furthermore, the erratic operation of the channel selection device due to the audio signal carrier can be prevented, and the selected channel can be prevented from stepping to another channel due to the fading or interruption of the signals.

The above and other objects, features and advantages of the present invention will become more apparent from the following description of the preferred embodiment thereof taken in conjunction with the accompanying drawing.

Figure 1A:
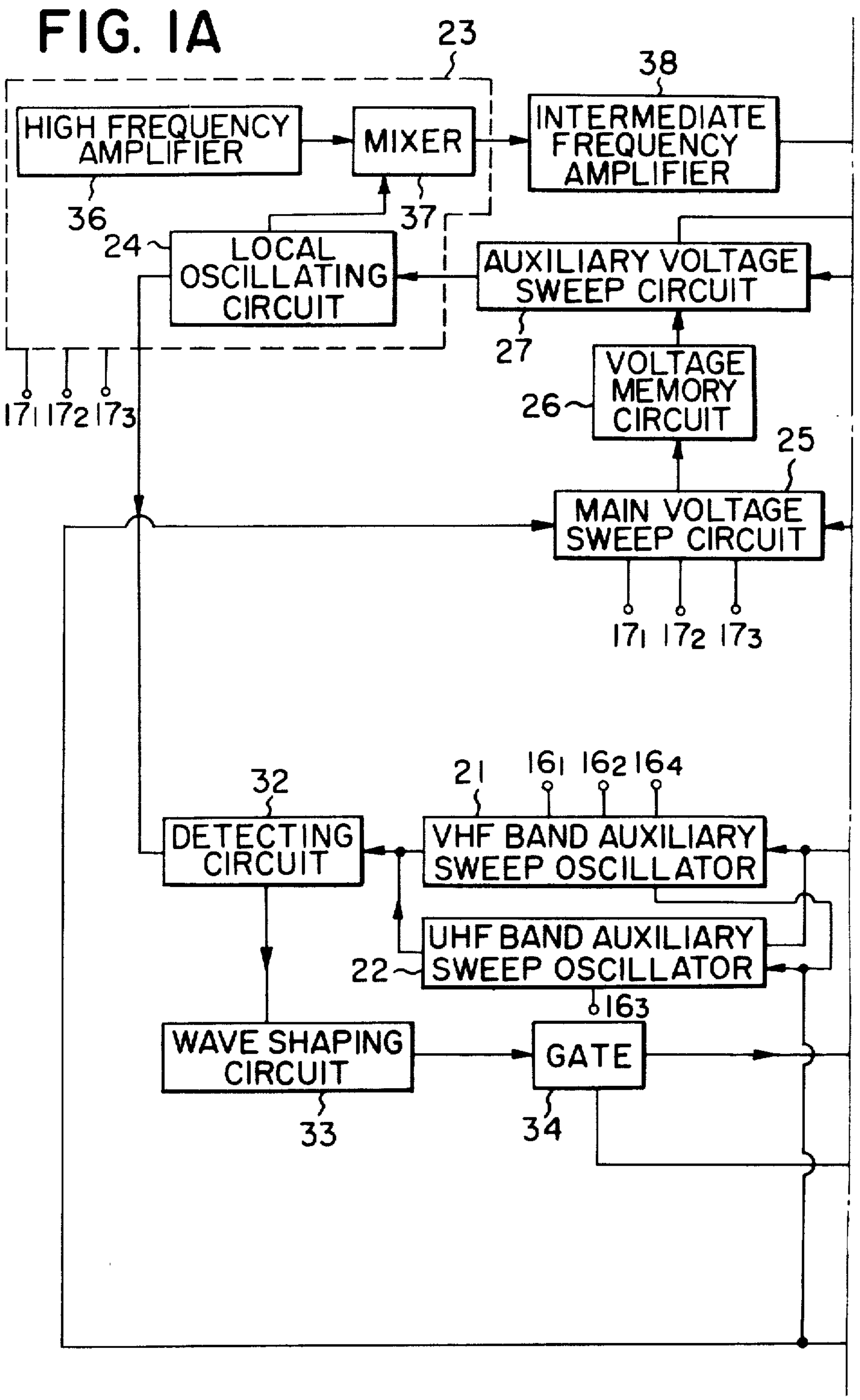
FIGS. 1A, 1B, 1C & 1D are block diagrams of a channel selection device in accordance with the present invention.
Figure 1B:
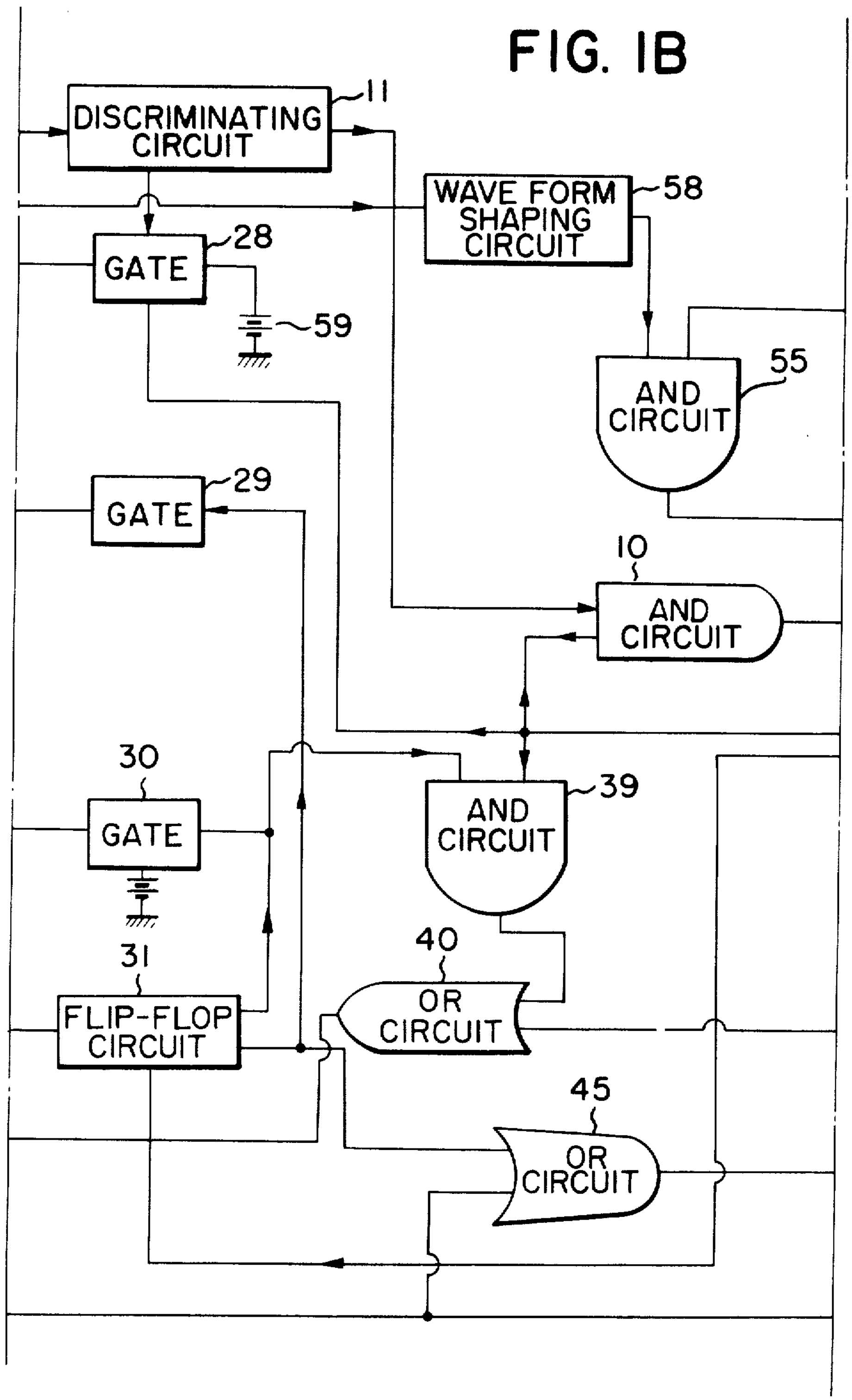
Figure 1C:
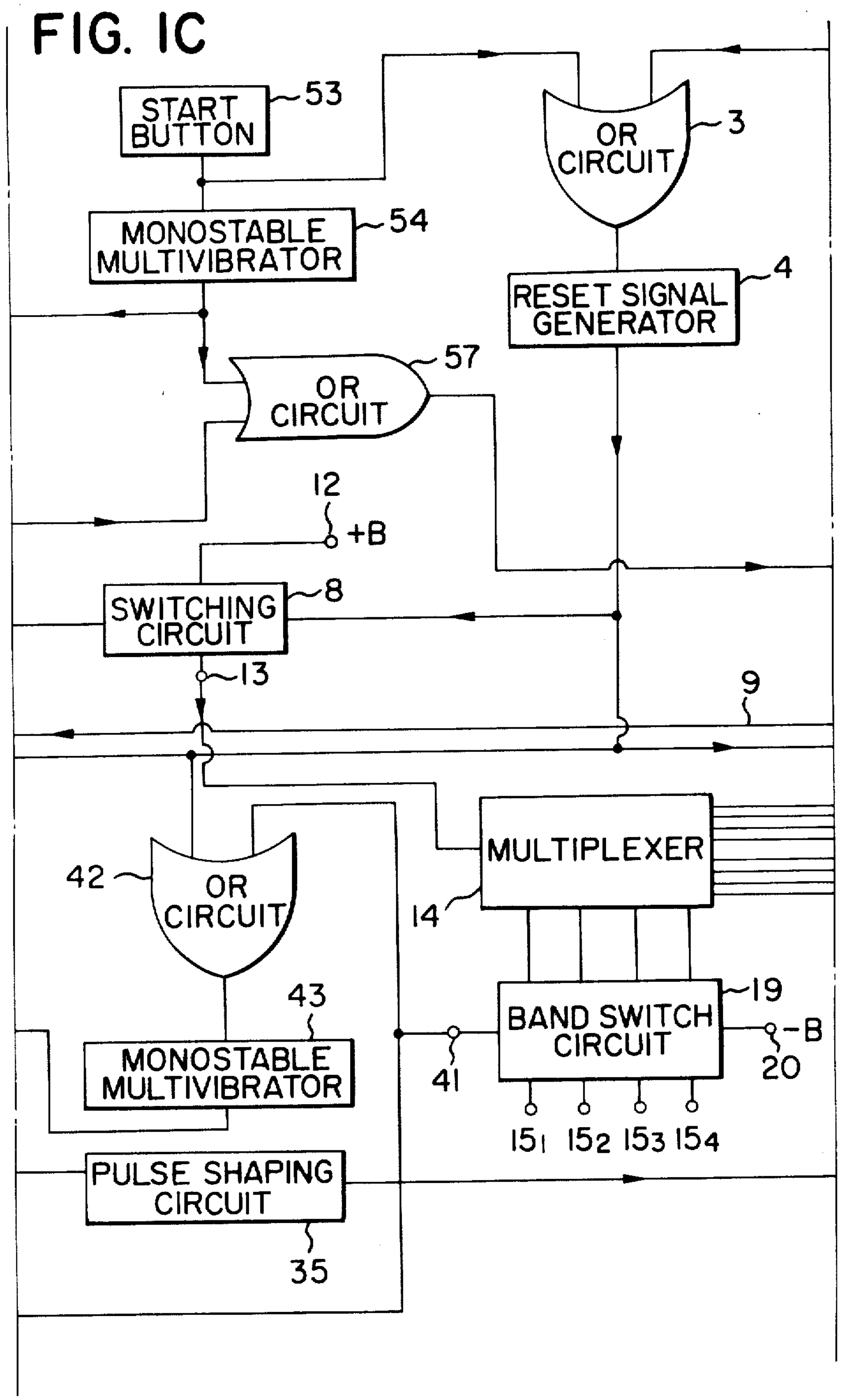
Figures 1A, 1B, 1C, 1D:
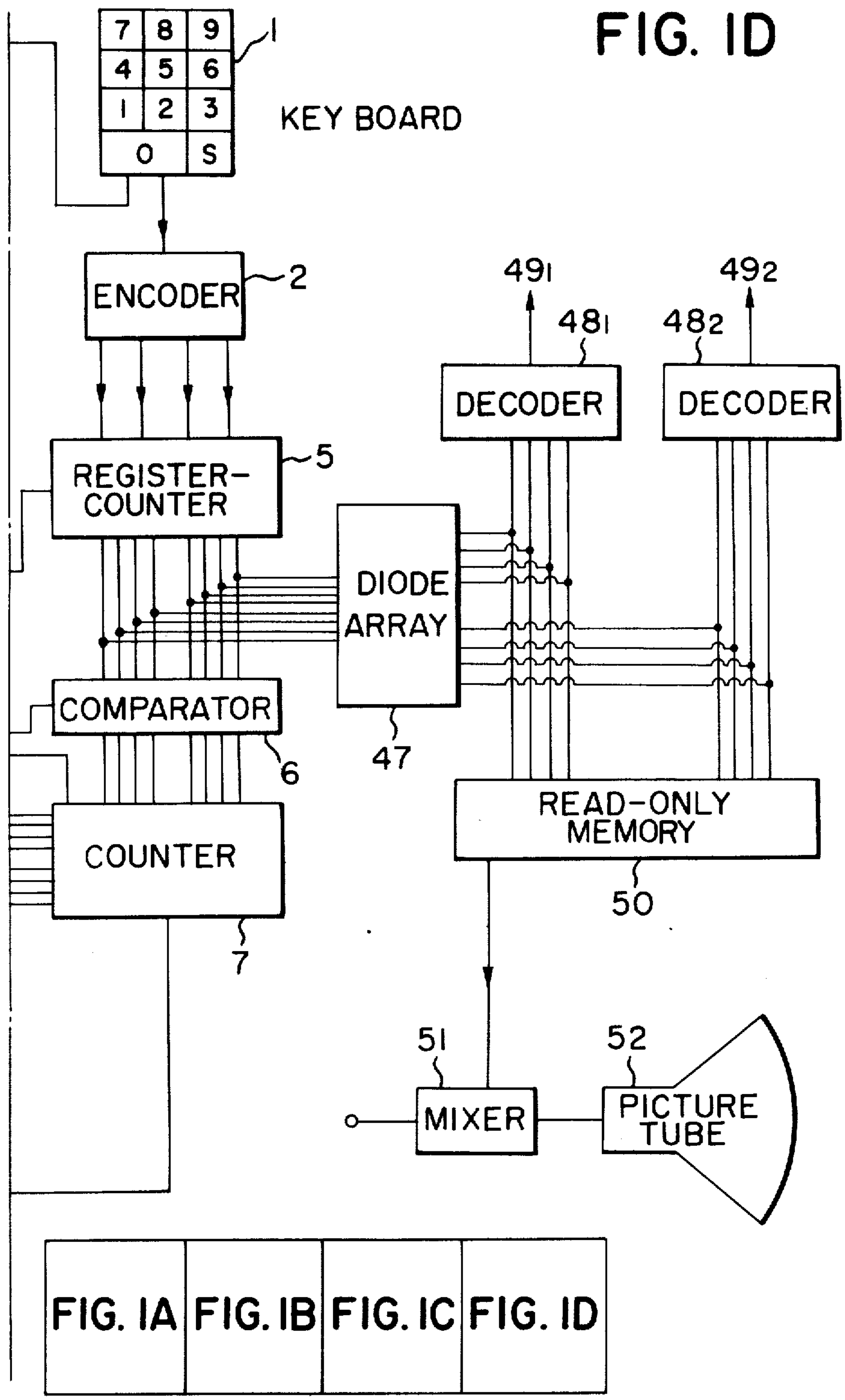

DESCRIPTION OF THE PREFERRED EMBODIMENT:

Referring to FIG. 1, a keyboard 1 is used to set a desired TV channel into a tuning device. For example, the buttons 0 and 3 are depressed in the order named to select the channel 3, and the buttons 3 and 4 are depressed to select the channel 34. The digital numbers selected by depressing the buttons on the keyboard 1 are encoded by an encoder 2 into binary codes each consisting of four bits. When the button on the keyboard 1 is depressed, the reset signal is applied through an OR gate 3 to a reset signal generator 4 to reset both a counter 7 and a switching circuit 8. As a result, the channel 0 is reset in the counter 7, whereas the switching circuit 8 is connected to a B power source +B. A flip-flop 31 is also reset to make an auxiliary voltage sweep circuit ready to actuate as will be described in more detail hereinafter.

The binary coded signals from the encoder 2 are applied to a register 5 which also functions as a counter (and will be referred to as "register-counter" hereinafter for brevity), and the two-digit-8-bit signals from the register-counter 5 are applied to a comparator 6 where the content in the counter 7 is compared with the content in the register-counter 5 to provide output signals representing whether the two contents are coincident or not, from an output terminal 9. That is, since the counter 7 is reset to 0 as described above, the non-coincidence signal is derived from the output terminal 9, and is applied to the switching circuit 8 through an AND gate 10, which provides an signal only when the coincidence signal from the output terminal 9 is applied to one input terminal thereof simultaneously with the signal from a discriminator 11 representing the reception of 58.75 MHz. In place of the discriminating circuit, a synchronizing separator circuit or an AGC voltage circuit may be used. In response to the signal from the AND gate 10, the switching circuit is turned off, but when no signal is derived from the gate 10, the switching circuit is turned on so that the +B power source is coupled to a multiplexer 14 through an output terminal 13. In response to the binary coded signals from the counter 7, the multiplexer 14 selects output terminals $15_1$–$15_4$. That is, for channels 0–3, the terminal $15_1$ is selected; for channels 4–12, the terminal $15_2$ is selected; and for channels 13–62, the terminal $15_3$ is selected. The terminal $15_4$ is an output signal terminal to a circuit which is provided to overcome the problem that the channels 7 and 8 are overlapped over two MHz band. The terminal $15_1$ is connected to terminals $16_1$ and $17_1$; the terminal $15_2$, to terminals $16_2$ and $17_2$; the terminal $15_3$, to the terminals $16_3$ and $17_3$; and the terminal $15_4$, to terminals $16_4$ and $17_4$, respectively. A –B voltage source terminal –B is provided to derive the negative voltage from a band switching circuit 19 in response to the outputs of the multiplexer 14. The terminal $16_1$ is an input terminal of an auxiliary VHF band sweep oscillator 21, and the terminal $16_2$ is an input terminal of a switching diode which is inserted to select either of the higher or lower band in the VHF band. The terminal $16_3$ is an input terminal of an auxiliary UHF band sweep oscillator 22 to apply the +B voltage thereto, and the terminal $17_1$ is an input terminal of the VHF section of a tuner 23 to apply the +B voltage thereto. The terminal $17_2$ is the terminal that selects either the higher or lower band in the VHF band in the tuner 23; the terminal $17_3$, the terminal to the UHF band thereof to apply the +B voltage thereto; and the terminal $16_4$ is used to lower the oscillation frequency by two MHz when the channel 7 is switched to channel 8 in the VHF band sweep oscillator 21.

Figure 2:
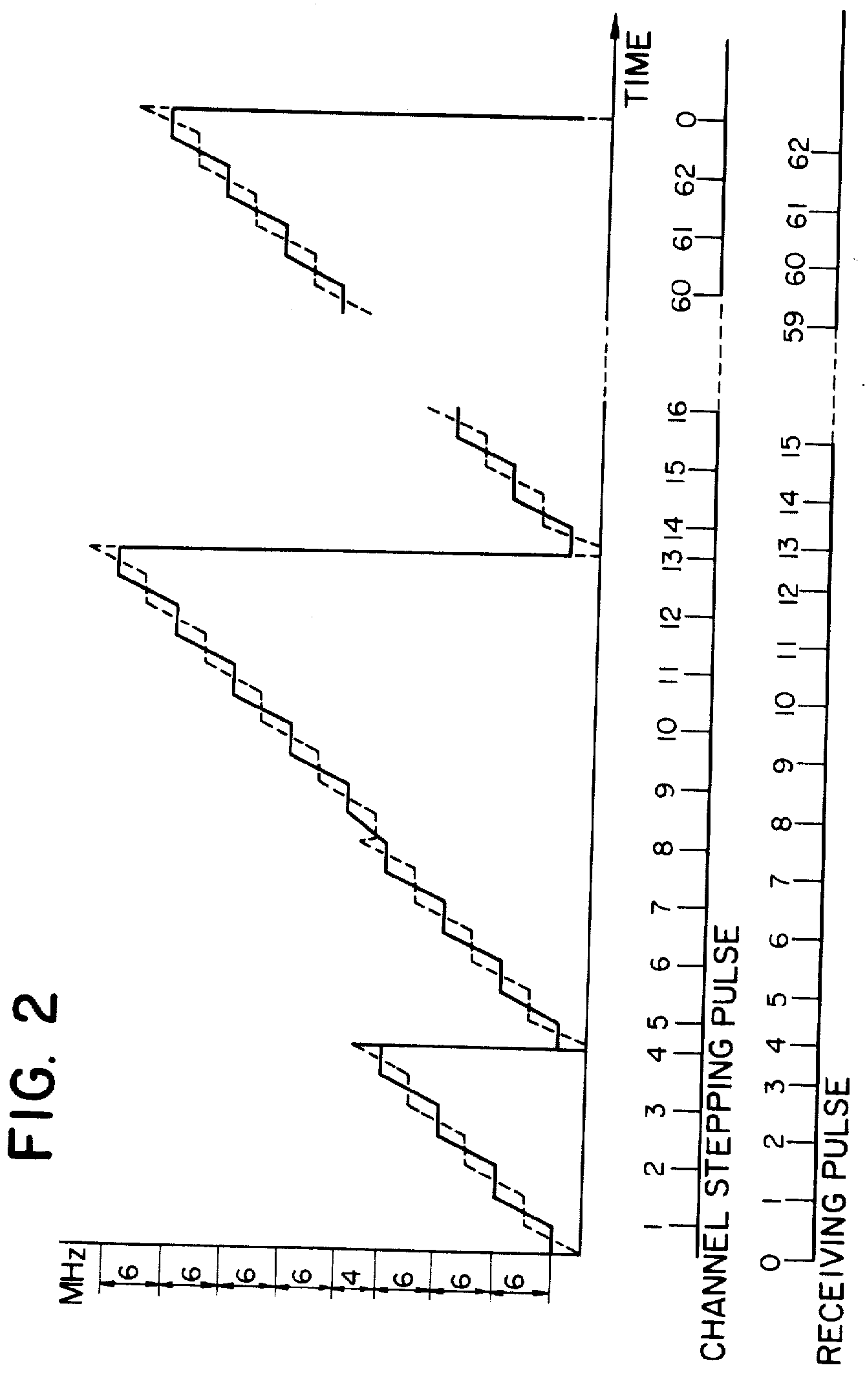
FIG. 2 is a diagram used for explanation of the mode of operation thereof.

When the reset circuit 4 is actuated, the content of the counter 7 is reset to 0. As a result, the band switch 19 provides an output signal in response to which the auxiliary sweep oscillator 21 and a local oscillating circuit 24 in the tuner 23 operates at the lower band of the VHF band. The auxiliary sweep oscillator 21 starts immediately sweeping, and the local oscillating circuit 24 oscillates at a frequency which is the intermediate frequency plus a frequency assigned to the channel 0 below the lowermost frequency of the channel 1 as indicated by the horizontal solid line at the left end in FIG. 2. In FIG. 2, the solid lines indicate the oscillation frequencies of the local oscillator 24, whereas the dotted lines, the oscillation frequencies of the auxiliary sweep oscillator 21 which starts the sweep from the frequency 3 MHz higher or lower than the oscillation frequency of the local oscillator 24.

The oscillation frequency of the local oscillator 24 is determined by a voltage applied across a variable capacity diode in the local oscillator 24 which voltage is derived by superposing the voltage from a main voltage sweep circuit 25 stored in a voltage memory circuit 26, over the sweep voltage from an auxiliary voltage sweep circuit 27. The input to a gate 28 is so determined that the auxiliary voltage sweep circuit is not actuated in the initial step to generate the zero voltage. A gate 29 which is controlled by a flip-flop 31 is off when a gate 30 is on, and is on when the gate 30 is off. When the oscillation frequency of the auxiliary sweep oscillator 21 becomes 3 MHz higher than that of the local oscillator 24, a channel stepping-up signal is applied to the flip-flop 31 through a 3 MHz detecting circuit 32, a waveform shaping circuit 33, and a gate 34. In response to the output of the flip-flop 31, the alternate start and stop of the sweep by the local oscillator 24 and the auxiliary sweep oscillator 21 are controlled in such a manner that the auxiliary sweep oscillator 21 stops sweeping, whereas the local oscillator 24 starts to sweep. That is, in response to the output from the gate 34, the transition of the flip-flop 31 from one state to another occurs, and the gate 29 is on, whereas the gate 30 is off. As a result, the auxiliary sweep oscillator 21 stops sweeping, whereas the main voltage sweep circuit 25 starts to sweep so that the local oscillator 24 also starts to sweep. This is indicated by the bending points of the solid and dotted lines immediately above the channel stepping pulse 1 in FIG. 2.

When the oscillation frequency of the local oscillator 24 becomes 3 MHz higher than that of the auxiliary sweep oscillator 21, the reception pulse 1 is generated. In a similar manner, the channel stepping pulses and reception or receiving pulses shown in FIG. 2 are generated.

The output of the flip-flop 31 is applied to the counter 7 through a pulse waveform shaping circuit 35 in synchronism with the channel stepping pulse. As described hereinbefore, when the contents stored in the counter 7 and the register-counter 5 are not coincident, the non-coincidence signal is generated from the comparator 6, whereas the coincidence signal is generated when the contents are coincident. When the input to the gate 30 is applied to the input terminal of a gate 39 simultaneously with the coincidence signal from the comparator 6, the output of the gate 39 is applied to a gate 34 through an OR gate 40 to interrupt the pulses from the waveform shaping circuit 33. As a result, the flip-flop 31 is de-energized so that the output curve of the local oscillator 24 becomes horizontal as shown in FIG. 2. Therefore, when the oscillation frequency of the local oscillator 24 is increased to the desired channel frequency selected by depressing the buttons on the keyboard 1, the flip-flop 31 is de-energized but the local oscillator 24 continue to oscillate.

When the flip-flop 31 is de-energized, the gate 29 is turned off, whereby the main voltage sweep circuit 25 is de-energized; that is, stops the sweep. The voltage at which the main voltage sweep circuit stops the sweep, is stored in the voltage memory circuit 26. The coincidence signal from the comparator 6 turns on the gate 28 to cause an auxiliary voltage sweep circuit 27 to sweep. The voltage from the auxiliary voltage sweep circuit 27 is superposed upon the voltage stored in the voltage memory circuit 26, and is applied to the variable capacity diode in the local oscillator 24. The oscillation frequency of the local oscillator is increased, and the intermediate frequency signals are obtained in response to the frequency of the received signal from a high frequency amplifier 36 through a mixer 37. The intermediate frequency signals are applied to the 58.75 MHz discriminator 11 through an intermediate frequency amplifier 38. When the discriminator 11 discriminates the 58.75 MHz, its output controls the gate 28 to determine whether a capacitor in the auxiliary sweep circuit 27 must be charged or not. As a result, the normal local oscillation frequency is automatically controlled, and the local oscillation frequency for the desired channel can be obtained.

The output of the discriminator 11 is also applied to the AND circuit 10, which provides an output signal when the coincidence signal from the comparator 6 is also applied thereto. And in response to the signal from the AND circuit 10, the switching circuit 8 is actuated to disconnect the +B power source from the auxiliary sweep oscillators 21 and 22.

Next the mode of band switching will be described. When the channel stepping pulses 4, 13 and 0 are generated as shown in FIG. 2, a band switching pulse is derived from an output terminal 41 of the band switching circuit 19 to reset the auxiliary sweep oscillators 21 and 22 and the main voltage sweep circuit 25. As a result, the charge on the voltage sweep capacitor is discharged, and it is required to eliminate or erase the pulse from the detecting circuit 32 when the capacitor is discharged. For this purpose, the band switching pulse from the band switching circuit 19 is applied as the pulse elimination or erasure signal to the gate circuit 34 through the OR circuit 42, the monostable multivibrator 43 and the OR circuit 40. The reception pulses 4, 13 and 0 shown in FIG. 2 will not be generated in the arrangement described above. Therefore the band switching pulse is derived from the band switching circuit 19, not from the 3 MHz discriminator 32. As shown in FIG. 2, the auxiliary sweep oscillators 21 and 22 are so arranged as to decrease their oscillation frequencies by 2 MHz in response to the channel stepping pulse 8 shown in FIG. 2. Then, when the next reception pulse 8 is applied to the counter 7, the voltage for reception of channel 8 becomes higher than that for reception of channel 7 by a voltage which corresponds to or is equivalent to 4 MHz.

The binary coded signals stored in the register-counter 5 are applied to decoders $48_1$ and $48_2$ through a diode array 47, whereby the selected channel is displayed by channel indicators $49_1$ and $49_2$. The first digit or the most significant digit of the channel are displayed through the decoder $48_1$ and the channel indicator $49_1$, while the second digit, by the decoder $48_2$ and the indicator $49_2$. Alternatively, the binary coded signals are applied to a read-only memory 50 the output of which is mixed with the video signals by a mixer to be displayed on a picture tube 52.

When a remote control unit is used for channel selection, a remote control start button 53 is depressed to actuate a monostable multivibrator 54 and also the reset signal generator 4 through the OR gate 3, thereby resetting the counter 7, the switching circuit 8, and the sweep circuits 21, 22 and 25 in the manner described hereinbefore. Therefore, the channel selection is started from the channel 0.

The output of the monostable multivibrator 54 is applied through an OR gate 57 to the register-counter 5, and the content in the register-counter 5 is increased by one. The comparator 6 compares the contents of the register-counter 5 and the counter 7, and applies the non-coincidence signal from its output terminal 9 to the switching circuit 8 through the AND gate 10. As a result, the +B power source is connected to the multiplexer. Since the channel 0 is stored in the counter 7, the band switch 19 causes the auxiliary sweep oscillators 21 and 22 and the local oscillator 24 to sweep in the lower band of the VHF band. The oscillation frequency of the local oscillator 24 is the frequency assigned to the channel 0 plus the intermediate frequency. The sweep oscillators 21 and 25 alternately start to sweep every 3 MHz, and the content of the counter 7 is increased by one every 3 MHz in the manner described hereinbefore in conjunction with the channel selection by the keyboard 1 so that no further description will be made.

When the contents of the register-counter 5 and of the counter 7 are coincident, the comparator 6 applies an output the coincidence signal to the AND gate 39, which outputs the signal through the OR gate 40 to the gate 34 when the output of the flip-flop 31 is simultaneously applied to the AND gate 39. As a result, the gate 34 is turned off, and the flip-flop 31 is turned off, but the local oscillator 24 keeps oscillating even though it stops sweeping. When the main voltage sweep circuit 25 stops sweeping, the voltage at which the sweep circuit 25 stops sweeping is stored in the voltage memory circuit 26. In response to the coincidence signal from the comparator 6, the gate 28 is turned on, and a power source 59 is coupled to the auxiliary voltage sweep circuit 27 so that it starts to generate the sawtooth waveform signals. The oscillation frequency of the local oscillator 24 in the tuner 23 is increased so that the intermediate frequency of the signals from the high frequency amplifier 36 through the mixer stage 37 is also increased.

When there is no output from the 58.75 MHz discriminator 11, the auxiliary voltage sweep circuit 27 returns to its initial condition after it has swept 4 MHz. In this case, the fly-back line pulse is derived from the auxiliary voltage sweep circuit 27, and is applied to the AND gate 55 through a waveform shaping circuit 58. Since the AND gate 55 is ready to provide an output signal when the output from the waveform shaping circuit 58 is applied thereto, the output pulse from the circuit 58 is applied to the register-counter 5 through the AND and OR gates 55 and 57.

Therefore, the content in the register-counter 5 is increased by one, and becomes greater than the content in the counter 7 by one. The output of the comparator 6 is the noncoincidence signal, which is applied to the AND gate 39. Therefore, the channel selection device has been returned to the condition under which the device is started so that the operation described hereinbefore is repeated. When the main voltage sweep circuit 25, the register-counter 5 and the counter 7 are operated to the channel being televised and when the auxiliary voltage sweep circuit 27 is actuated and the output is derived from the 58.75 discriminator 11, the gate 28 is turned off to disconnect the power source 59 from the auxiliary voltage sweep circuit 27. As a result, the voltage sweep is stopped, and the local oscillator oscillates at the normal frequency. The output of the discriminator 11 is applied through the AND gate 10 to the switching circuit 8 so that the auxiliary sweep oscillators 21 and 22 are disconnected from the power source +B. When the discriminator 11 is discriminating the 58.75 MHz frequency, the auxiliary voltage sweep circuit 27 does not generate the fly-back line pulse. Therefore, the television receiver continues to receive the selected channel. The remote control unit described above is also actuated in the similar manner when a pushbutton or the like attached to the TV receiver is depressed to select a desired channel. The term "remote control button" refers to a remote control switch, which may be a switch connected through wires to the TV receiver or a wireless control unit which is adapted to actuate a switch in the TV receiver by the intermittent oscillations of ultrasonic waves.

In FIG. 2, the two oscillation frequencies are indicated by the solid and dotted lines, respectively. When the band is switched, the sweep by the frequency indicated by the dotted lines is temporarily stopped, and then started again. In this case, the oscillation frequency indicated by the dotted lines is a frequency at the lower channel boundary of the lowest channel in the band, plus the intermediate frequency.

So far the channel selection device has been described in conjunction with the Japanese TV channel standards, but it will be understood that the present invention may be applied to any system such as FCC system in USA, CCIR system in western Europe, the system in eastern Europe, the French system, the system used in United Kingdom, and so on.

In FIG. 1 the auxiliary voltage sweep circuit 27 has been shown as being inserted next to the voltage memory circuit 26, but it may be directly connected to the main voltage sweep circuit. Alternatively, the main sweep voltage may be applied to one terminal of the variable capacity diode in the tuner 23, whereas the auxiliary sweep voltage, to the other terminal thereof.

The ratio of the change in the received frequency to the voltage applied across the variable capacity diode in the tuner 23 is different in the higher and lower bands of the VHF band or in the UHF and VHF bands. Therefore, in order to determine the width of the auxiliary sweep frequency as 4 MHz, the width of the sweep voltage must be determined appropriately for each band.

The register-memory 5 may be connected to an independent power source different from that of the TV receiver so that the power is always supplied to the register-counter 5 even when the TV receiver is turned off. Then, when the TV receiver is turned on, it receives the same channel at which the TV receiver has been turned off.

The band is switched by the band switch 19 only when the first signal generated every 3 MHz is applied to the counter 7. For example, the lower band in the VHF band is switched to the higher band when the 3 MHz signal of the channel 4 is generated as shown in FIG. 2. Thus, the TV channel selection device in accordance with the present invention can be advantageously controlled by the signal which is generated at every 3 MHz and the stop signal.

In order to determine the upper limits in the sweep by the sweep oscillators 21, 22 and 25, the trigger signal is applied to an SCR in the sweep circuit in response to the band switching signal from the band switch 19.

From the foregoing description, according to the present invention, it is not required to preset by a variable resistor a voltage applied across the variable capacity diode. In the prior art TV channel selection device, each channel must be adjusted by a preset variable resistor, but according to the present invention, every channel can be received without any adjustment.

In the so-called automatic tuning system in which a voltage is applied from a voltage sweep circuit across a variable capacity diode, and the sweep is stopped when a desired intermediate frequency is obtained, it has been extremely difficult to digitally display a selected channel, but according to the present invention, the digital display becomes possible. In such an automatic tuning system, the audio frequency carrier sweep is stopped so that there must be provided means for displaying the channel. However, according to the present invention the main and auxiliary voltage sweep circuits are provided so that this problem is overcome. Furthermore, in the automatic tuning system in the prior art, there is a tendency that a selected channel tends to be stepped up to the next channel due to the fading or interruption of the signal waves, but this problem can be overcome because of the main and auxiliary voltage sweep circuits. Furthermore, the problem of instability in automatic tuning in area of weak field intensity can be overcome.

The curves indicating the relation between the frequency received by the tuner 23 and the voltage applied across the variable capacity diode are different for each tuner. Therefore, when the channel selection and adjustment by the preset variable resistors in the prior art are made, the characteristics of the channel indicator and the above characteristic curve must be matched. But, in practice, complete matching is very difficult. However, according to the present invention, this problem is overcome because the desired channel is selected and displayed based upon the reference frequency between the adjacent channels.

In the prior art automatic tuning system by voltage sweep, the sweep is stopped at an image intermediate frequency appearing in reception of UHF band so that the image ratio of the tuner must be improved. However, according to the present invention, this problem can be eliminated.

While it will be apparent that any conventional circuits may be employed for the components in accordance with the invention, examples of some of the circuits which may be employed are as follows:

The binary encoder 2 may be a circuit such as shown in FIG. 20 of U.S. Pat. No. 3,654,557. The multiplier 14 may be a circuit such as is shown in FIG. 10 of U.S. Pat. No. 3,654,557. The band switching circuit 19 may be of the form shown in U.S. Pat. No. 3,654,557. The decoders 48–1 and 48–2 may be the type disclosed in "The Integrated Circuit Catalog", Ser. No. 74,141, published by the Texas Instruments, Inc. The counter 7 may be in the form shown in U.S. Pat. No. 3,654,557 at FIG. 5.

Figure 3A:
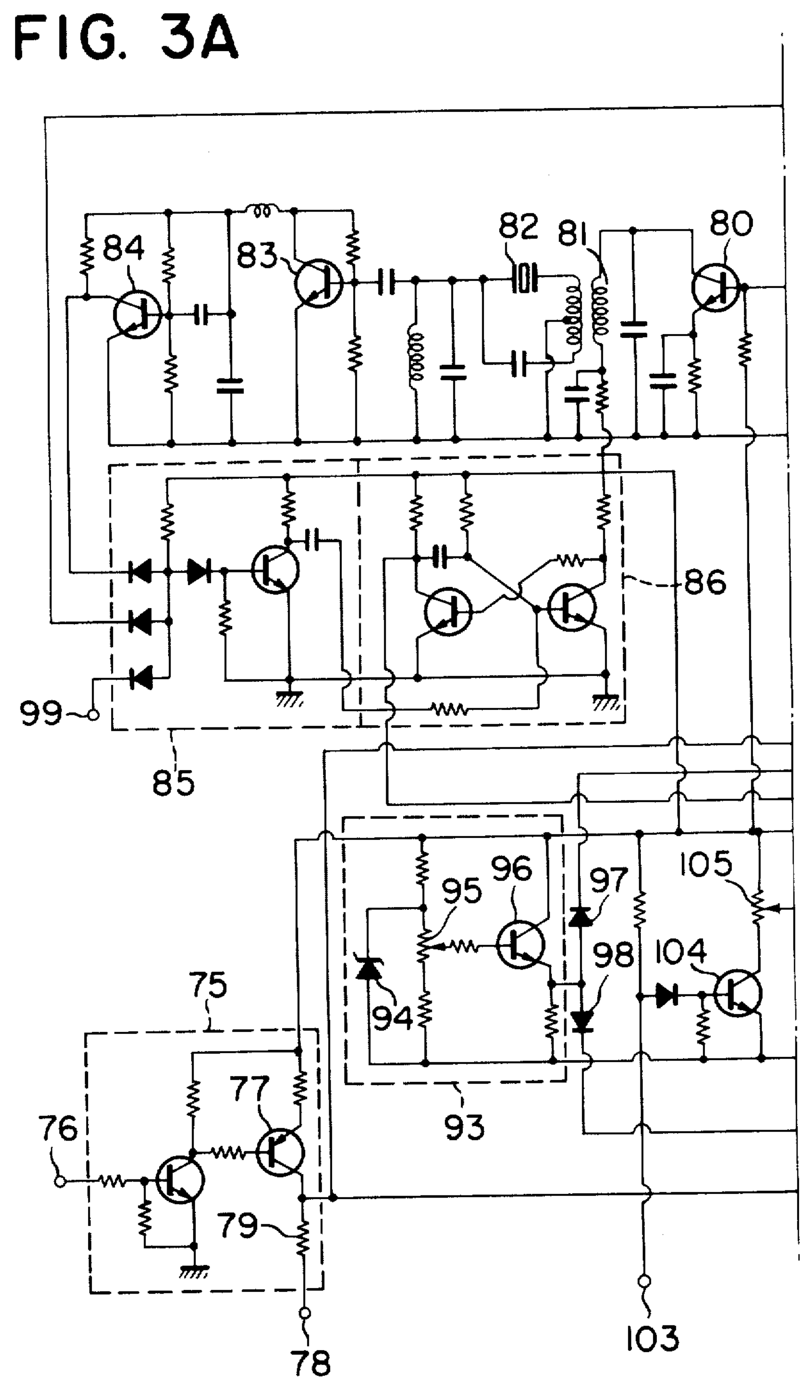
FIGS. 3A, 3B & 3C are diagrams of a practical circuit of the embodiment shown in FIG. 1.
Figure 3B:
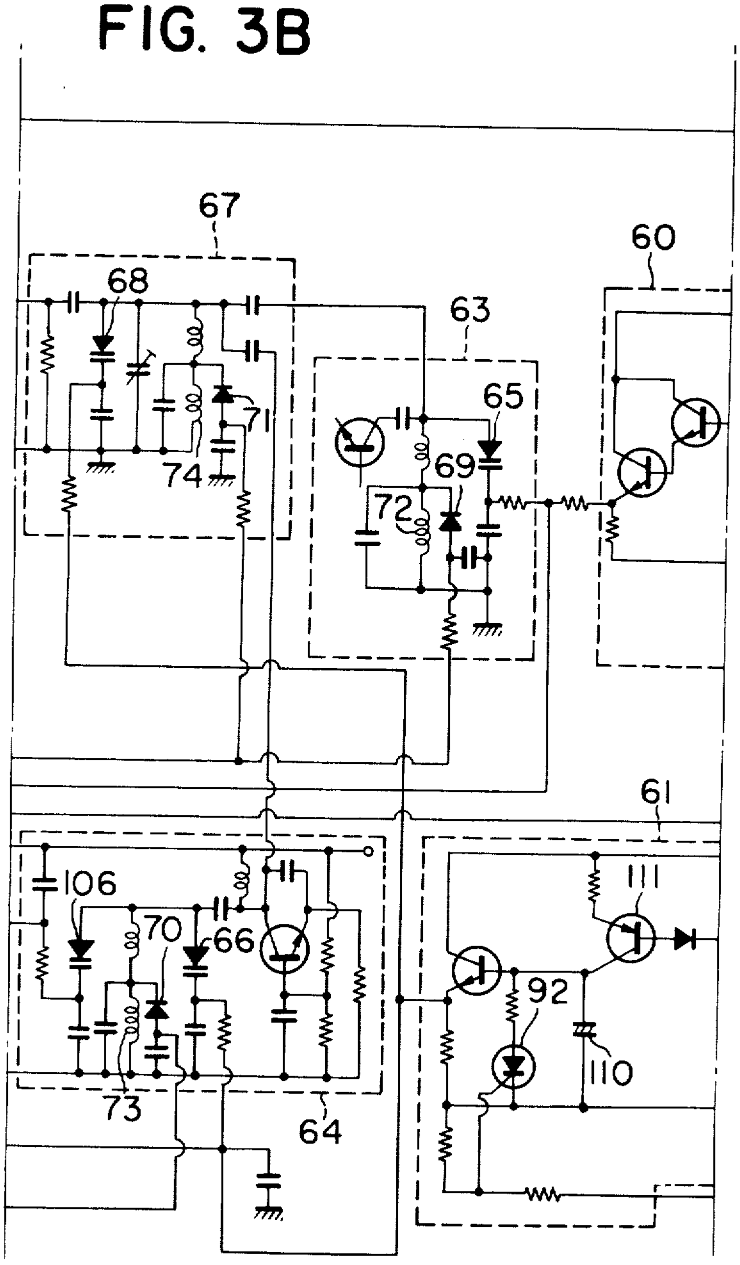
Figure 3C:
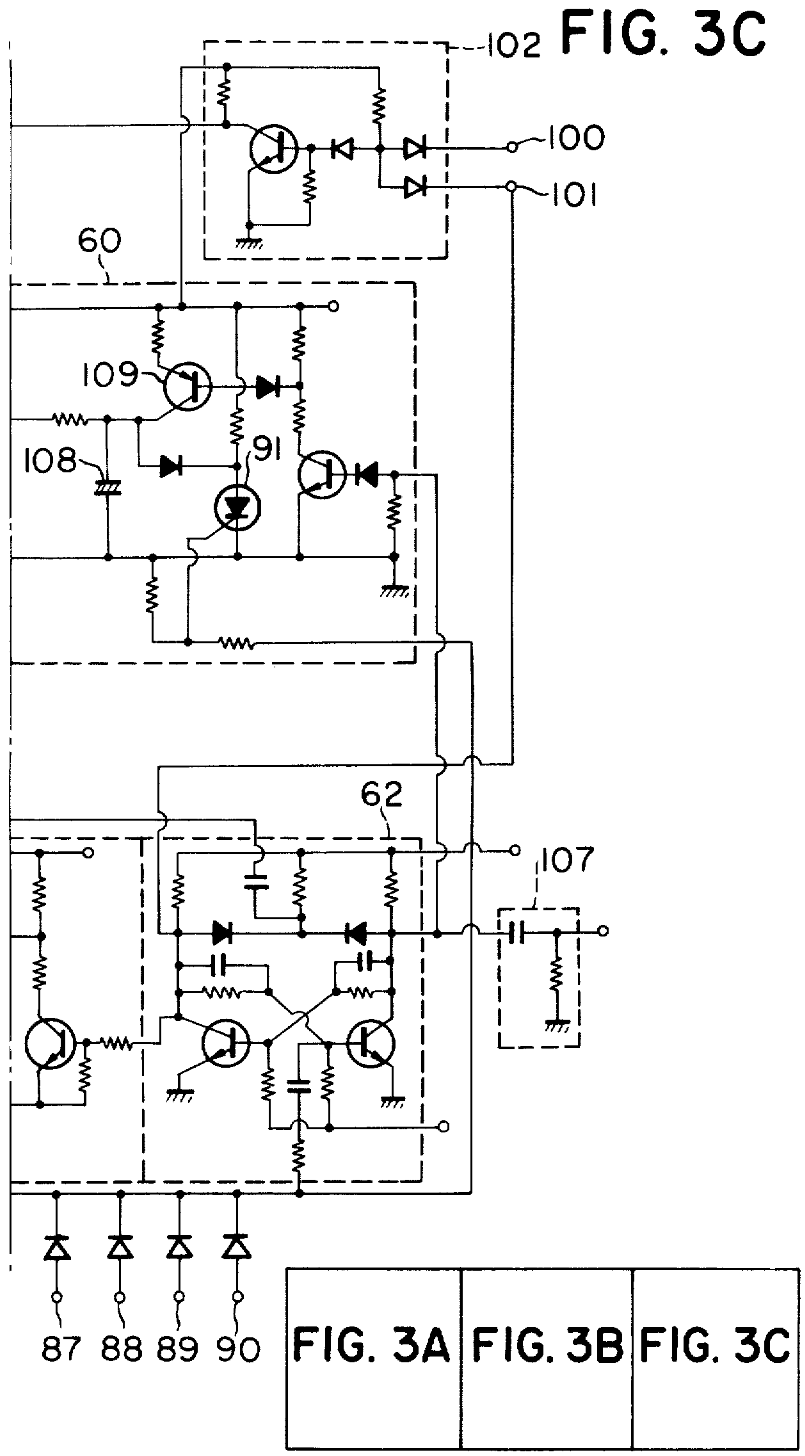

Next the practical embodiment of the TV channel selection device in accordance with the present invention will be described with reference to FIGS. 3 and 4. In FIG. 3, reference numeral 63 designates the local oscillator 24 shown in FIG. 1; an auxiliary voltage sweep circuit 61 and an oscillator 64 correspond to the sweep oscillator 21; a main voltage sweep circuit 60, the main voltage sweep circuit 25 and the voltage memory circuit 26; an input tuning circuit 67 and transistors 80–83, the 3 MHz discriminator 32; a transistor 84, the waveform shaping circuit 33; 85, the gate 34; and flip-flop 62, the flip-flop 31. It is noted that the auxiliary voltage sweep circuit is not used in the circuit shown in FIG. 3.

The flip-flop 62 causes the main and auxiliary voltage sweep circuits 60 and 61 to alternately sweep, and the oscillation frequency of the oscillator 63 is controlled in response to the output voltage of the main sweep circuit 60. The oscillation frequency of the oscillator 64 is controlled in response to the output voltage of the auxiliary sweep circuit 61. Variable capacity diodes 65 and 66 are inserted in the oscillators 63 and 64, respectively. An input tuning circuit 67 detects the difference in oscillation frequency between the oscillators 63 and 64, and has a variable capacity diode 68. Coils 72, 73 and 74 are short-circuited to the ground level in a high frequency manner or opened in response to the conduction and non-conduction of diodes 69, 70, and 71, respectively which in turn are controlled by a control circuit 75. When the positive voltage signal is applied to an input terminal 76 of the control circuit 75, the forward current flows through a transistor 77, whereas the zero voltage is applied to the terminal 76, a negative voltage applied to an input terminal 78 is applied through a resistor 79 having a high magnitude to the diodes. The circuit components and circuits 69–79 constitute a band switching circuit for example to switch the higher band of the VHF band to the lower band.

The outputs of the oscillators 63 and 64 are applied to the transistor 80 whose load; that is, a tuning circuit 81 is tuned to a frequency one half of the frequency between the adjacent TV channels. When the flip-flop 62 applies the positive voltage to the main sweep circuit 60 and the negative voltage to the auxiliary voltage sweep circuit 61, a capacitor 108 is charged with the current flowing from a transistor 109. Thus, the sweep voltage is established. A capacitor 110 is not charged because a transistor 111 is cut off, and the voltage across it remains unchanged. Therefore, of the high frequency signals applied to the transistor 80, the frequency which belongs to the main sweep circuit 60 is being swept, whereas the frequency which belongs to the auxiliary sweep circuit 61 is not swept. When the difference in frequency reaches the tuning frequency of the tuning circuit 81, the output is derived therefrom and is applied to a detecting transistor 83 through a narrow-band amplifier including a piezoelectric resonator 82 such as a crystal resonator. The reason why the output of the tuning circuit 81 is made to pass through the narrow-band amplifier including the piezoresonator 82 is that the channel width frequency; that is, the frequency between lower and upper boundary frequencies of each channel, can be controlled with a higher degree of accuracy and that the tuning circuit 81 is prevented from functioning as a channel width frequency detector at the slope of the frequency characteristics of a tuning amplifier (which is not the narrow-band amplifier of the type described). The pulse signal from the transistor 83 is shaped by a transistor 84, and is applied to a pulse waveform shaping circuit 86 including a monostable multivibrator. The output of the shaping circuit 86 is applied to the flip-flop 62 to cause it to shift. As a result, the auxiliary sweep circuit 61 starts to sweep while the main sweep circuit 60 stops sweeping. When the main and auxiliary sweep circuits 60 and 61 are alternately actuated to sweep in the manner described above, the sweep frequencies as shown in FIG. 4 are obtained.

Figure 4:
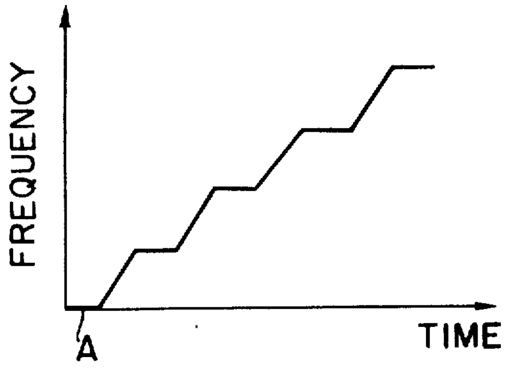
FIG. 4 is a diagram used for explanation of the mode of operation thereof.

The horizontal portions, that is the constant frequencies shown in FIG. 4 correspond to the channel width frequency so that the tuning frequency of the tuning circuit 81 is one half of the channel width frequency. Furthermore, the operation to be described hereinafter is required. When the charged voltages in both the main and auxiliary sweep circuits 60 and 61 are once discharged, the sweep by the main sweep circuit is started after the auxiliary sweep circuit 61 has completed its sweep and when the difference in frequency between the main and auxiliary sweep circuits reaches one half of the channel width frequency. For this purpose, when the reception is started, a reset pulse is applied to a terminal 87 to conduct both thyristors 91 and 92 to discharge the charged capacitors 108 and 110 and simultaneously to conduct the right transistor in the flip-flop 62. Even when the TV waves are divided into a plurality of bands, a pulse is applied to a terminal 88, 89 or 90 depending upon the lower or higher band of VHF band or the UHF band.

In order that the frequency indicated by A in FIG. 4 may coincide with the lowest channel frequency in each band, there is provided a clamping circuit 93 which comprises a constant voltage source 94, a voltage regulator 95, an emitter-follower transistor 96 of low output impedance, and diodes 97 and 98 for isolating the clamping circuit 93 when the transistor 96 is cut off. When the voltages of the main and auxiliary sweep circuits 60 and 61 are lower than the clamped voltage, the diodes 97 and 98 are conducted so that the clamped voltage is applied across the variable capacity diodes 65 and 66. On the other hand, when the sweep voltages of the circuits 60 and 61 are higher than the clamped voltage, they are applied across the variable capacity diodes 65 and 66. That is, the frequency A in FIG. 4 can be determined by the clamped voltage.

In switching bands, the capacitors in the main and auxiliary sweep circuits 60 and 61 are discharged, and there is a chance that the difference in frequency between the main and auxiliary sweep circuits 60 and 61 coincides with the tuning frequency of the tuning circuit 81 to generate the pulse which causes the erratic operation when applied to the flip-flop 62. To overcome this problem, an erasure pulse whose rising edge is the pulses applied to the terminals 87–90 is applied to the terminal 99.

When the positive voltage is applied to a terminal 100 to which is applied the command signal for stopping the sweep, whereas the positive voltage is applied to the output terminal for the auxiliary sweep of the flip-flop 62, the output of the AND circuit 102 becomes zero, whereby the gate 85 is closed. Therefore, noise pulses can be prevented from being applied to the flip-flop 62 during reception.

In the VHF band, the TV channel 7 has a frequency between 188 MHz and 194 MHz, whereas the channel 8 has a frequency from 192 MHz to 198 MHz. Therefore the channels 7 and 8 are overlapped over 2 MHz so that the stepped sweep frequency must be lowered by 2 MHz than the ordinary sweep frequency. For this purpose, the positive voltage is applied to a terminal 103 when the channel 8 is selected so as to conduct a transistor 104. As a result the voltage applied across a variable capacity diode 106 through a variable resistor 105 is lower than that when the channel 7 is selected. Therefore, the capacitance of the diode 106 is increased, whereby the oscillation frequency is lowered. The variable resistor 47 is adjusted so that the oscillation frequency drop is 2 MHz.

The output of the flip-flop 62 is counted through a differentiating circuit 107 in order to detect the number of channels being stepped up. When a desired channel is selected, a signal which represents that the desired channel has been selected, is applied to the terminal 100. The selected channel can be digitally displayed as described hereinbefore.

What is claimed is:

1. For a receiver receiving channels, said receiver including a tuner, a channel selection device comprising a. a main local oscillator in said tuner, said main local oscillator capable of having the oscillation frequency thereof swept in response to a control signal, b. an auxiliary local oscillator capable of having the oscillation frequency thereof swept in response to a further control signal, c. switching means connected to said main and auxiliary local oscillators for alternately providing said control signals to said main and auxiliary local oscillators, for alternately maintaining constant the frequency of the main local oscillator when the auxiliary local oscillator is sweeping and for maintaining constant the frequency of the auxiliary local oscillator when the main local oscillator is sweeping, d. frequency detection means connected to said main and auxiliary oscillators for detecting the frequency at which said oscillators are oscillating, e. means for manually selecting a desired channel f. means connected to said frequency detection means for producing a detection signal in response to a correspondence between the oscillation frequency of the main local oscillator and the frequency of said desired channel, and g. means for de-energizing said switching means in response to said detection signal and for maintaining said local oscillator oscillating at said frequency, whereby the channel selection device is automatically set to the frequency corresponding to the manually selected channel.

2. A channel selection device as set forth in claim 1, wherein each channel is separated from adjacent channels by a channel width frequency, said switching means for controlling the sweeping of said main and auxiliary local oscillators causing the alternating sweeping between said main and auxiliary local oscillators to occur at each channel width frequency sensed by said frequency detection means, and means for applying the sweep of said main and auxiliary local oscillators across a variable reactance element, said variable reactance element included in said main local oscilltor, said means for applying said sweep voltages comprising a. a main voltage sweep circuit for applying a voltage across said variable reactance element, b. an auxiliary voltage sweep circuit commencing its sweep immediately after said main voltage sweep circuit stops sweeping, said auxiliary voltage sweep circuit applying a sweep voltage across said variable reactance element superposing over the sweep voltage of said main voltage sweep circuit.

3. A channel selection device as set forth in claim 1, wherein said main and auxiliary local oscillators start their respective sweeps from respective reference frequencies, said reference frequencies being predetermined for each frequency band used in TV transmission, further comprising counter means for counting each time said main and said auxiliary local oscillators start and stop their respective sweeps, said counter means counting to a selected desired channel number.

4. A channel selection device comprising two sweep oscillators adapted to alternately sweep repetitively, each of said sweep oscillators capable of operating to sweep and being stopped from sweeping, only one of said oscillators sweeping at a given time, with said oscillators alternating said sweeping, frequency detecting means connected to said two sweep oscillators for detecting the frequency difference therebetween, means for stopping the sweep by one of said two sweep oscillators when the absolute difference in frequency between said two sweep oscillators reaches one half of a predetermined frequency, while starting the oscillation of the other of said two sweep oscillators and for repetitively causing the operation of said two sweep oscillators at said predetermined frequency difference to sweep and stop sweeping alternately, said channel selection device for use with a receiver having channels manually selected, said channels being separated from adjacent channels by a channel width frequency, said predetermined frequency forming said channel width frequency, means for counting the number of stoppings of the sweep by each of said two sweep oscillators, counting means for receiving the counting of the numbers of stoppings of said sweeps, means for registering the manually selected number of a desired channel, comparator means for comparing the number of said desired channel with the number of said stoppings and for stopping sweep of both said sweep oscillators in response to an equality between the numbers of stoppings of said sweeps and the registered number of the desired channel.

5. A channel selection device set forth in claim 4 wherein each of said two sweep oscillators includes a variable reactance element, and a voltage sweep circuit for applying the sweep voltage across said variable reactance element;

said means for causing said two sweep oscillators to alternately sweep further comprises a flip-flop;

voltage sweep capacitors in said two voltage sweep circuits are controlled and alternately charged in response to the outputs from said flip-flop; and said flip-flop is actuated in response to a pulse signal which is obtained by detecting a beat signal of a frequency one half of the channel width frequency which in turn is obtained by mixing the outputs of said two sweep oscillators.

6. A channel selection device set forth in claim 5 wherein said capacitors in said two voltage sweep circuits are discharged in response to a reset pulse when said one of said two sweep oscillator starts the sweep;

and simultaneously a predetermined active element in said flip-flop is conducted so that the sweep is started from the first channel in a channel band.

7. A channel selection device set forth in claim 6 wherein an erasure signal whose leading edge is said reset pulse is applied before the flip-flop input in order to erase the beat signal generated when said capacitors are discharged by said reset pulse.

8. A channel selection device set forth in claim 5 wherein after said other of said one of said two sweep oscillators has completed the sweep of the last channel in a channel band, said capacitors in said two voltage sweep circuits are discharged, and simultaneously a predetermined active element in said flip-flop is conducted to start the sweep from the first channel in the next channel band.

9. A channel selection device set forth in claim 8 wherein an erasure signal whose leading edge is said reset pulse is applied before the flip-flop input in order to erase the beat signal generated when said capacitors are discharged by said reset pulse.

10. A channel selection device set forth in claim 5 comprising a narrow-band amplifier, wherein said beat signal is amplified by said narrow-band amplifier said amplifier including a piezo-resonator, and said beat signal thereafter being detected.

11. A channel selection device set forth in claim 4 wherein said one of said two sweep oscillations further comprises a variable capacity diode across which is applied the sweep voltage from the voltage sweep circuit, and another variable capacity diode for controlling the oscillation frequency, a voltage for increasing or decreasing the oscillation frequency being applied across said another variable capacity diode during the sweep at an oscillation frequency.

12. A channel selection device as set forth in claim 4, wherein each of said main and auxiliary local oscillator circuits commences to sweep their respective oscillating frequency from a predetermined reference corresponding to a channel width related to the desired channel.

13. A channel selection device as set forth in claim 12, further comprising, means for sensing when the desired channel is switched from one receiving channel frequency band to another channel frequency band, means for sensing said changes in desired received channels and for resetting each of the operable states of both said main and auxiliary local oscillator circuits in response thereto, the oscillating frequency of the main local oscillator circuit being set to the frequency corresponding to the lowest frequency in said another channel frequency band.

14. Channel selection device as set forth in claim 4, wherein said means for causing both said sweep oscillators to alternately sweep comprises, a. means for comparing the oscillation frequencies produced by both of said sweep oscillators and for detecting a frequency of one half of the channel width frequency, a flip-flop actuated in response to the output of said detecting means for controlling said one sweep oscillator to be in one state and controlling the other said two sweep oscillators to be in the other state, means for controlling the alternate sweep by both of said sweep oscillators, comprising a counter circuit for counting the state reversals of said flip-flop, a register circuit for storing a channel to be selected, said comparator circuit generating a coincidence signal when the content in said register circuit coincides with a number of stoppings of said two sweep oscillators and an additional output signal, said additional output signal detecting an intermediate frequency in said tuner when a desired channel is selected, said output signal and said coincidence between said register circuit and said number of stoppings causing said disconnection between said power source and said one of two sweep oscillators.

15. A channel selection device set forth in claim 14 comprising a display device wherein a channel which is to be selected, and is registered in said register, is displayed by said display device.

16. A channel selection device set forth in claim 14 wherein said one of said two sweep oscillators further comprises a variable reactance element for controlling the oscillation frequency across which is applied the sweep voltage from a main voltage sweep circuit and an auxiliary voltage sweep circuit; in response to the output from said flip-flop, said main voltage sweep circuit is actuated to cause said other sweep oscillator to sweep to a frequency immediately before a predetermined frequency, and said auxiliary voltage sweep circuit is actuated immediately after the sweep by said main voltage sweep circuit is accomplished; if a desired channel is not selected by one sweep by said auxiliary voltage sweep circuit, a pulse which is generated during the flyback time of said sweep voltage of said auxiliary sweep circuit is applied to said memory circuit to increase the content thereof by one.

17. A channel selection device as set forth in claim 4 for use with a receiver having a tuner wherein one of said two sweep oscillators is disconnected from a power source in response to a coincidence signal corresponding to a coincidence between the counts of said counting means and registering means, and an output signal from means which detects an intermediate frequency in said tuner when a desired channel is selected.

18. A channel selection system comprising a main oscillator circuit including a main oscillator capable of oscillating at a constant frequency and means for sweeping the frequency of said main oscillator in response to a control signal, an auxiliary sweep oscillator including an auxiliary oscillator capable of sweeping the frequency of said auxiliary oscillator in response to a control signal and for maintaining a constant frequency of oscillation in the absence of said control signal, means for comparing the frequencies of said main oscillator and said auxiliary oscillator to produce an output signal in response to a given frequency difference therebetween, means responsive to said output signal for alternately providing said main oscillator circuit or said auxiliary sweep oscillator with said control signal for alternately controlling the sweeping of said main oscillator circuit and said auxiliary sweep oscillator.

19. A channel selection system as set forth in claim 18 wherein said channel selection system is utilized for TV reception capable of receiving TV channels, each of said TV channels relating to a respective frequency, each of said main and auxiliary oscillator alternately repeating the sweeping of their respective oscillating frequencies and each detected frequency difference equal to one half of the frequency between adjacent TV channels.

20. A channel selection system as set forth in claim 18, wherein said main oscillator circuit comprises means for sweeping the oscillating frequency therein, said means for sweeping the oscillating frequency comprising a variable reactance element capable of varying its reactance in response to a voltage applied thereto, a main voltage sweep circuit and an auxiliary voltage sweep circuit, both of said main voltage sweep circuit and said auxiliary voltage sweep circuit capable of applying the sweep voltages to said variable reactance element for sweeping the oscillating frequency of said main oscillator circuit, means for applying the sweeping voltages to said variable reactance elements for sweeping said main oscillator frequency, wherein said sweeping voltage is derived by means for superimposing both of the output voltages of said main and auxiliary sweep oscillator circuits, a voltage memory circuit for superimposing sweeping voltages of the output of said auxiliary sweep circuit upon the output of said main sweep circuit, means for stopping the voltage sweeping action of said main oscillator circuit in response to said means for comparing the frequencies of said main oscillator circuit and said auxiliary sweep oscillator circuit when said circuits are of a predetermined frequency difference, means for starting the voltage sweeping action of said auxiliary voltage sweep circuit immediately after said main voltage circuit stops its own voltage sweeping action, and means for stopping the voltage sweeping action of said auxiliary sweep circuit in response to a detector signal voltage which is obtained when said tuner detects the desired carrier frequency.

* * * * *